United States Patent
Harker

(10) Patent No.: US 7,418,025 B2
(45) Date of Patent: Aug. 26, 2008

(54) WAVELENGTH MONITORING METHOD AND APPARATUS AND METHOD OF MAKING SAME

(75) Inventor: Andrew Harker, Ipswich (GB)

(73) Assignee: Avago Technologies General IP Pte Ltd, Singapore (SG)

( * ) Notice: Subject to any disclaimer, the term of this patent is extended or adjusted under 35 U.S.C. 154(b) by 720 days.

(21) Appl. No.: 10/388,771

(22) Filed: Mar. 17, 2003

(65) Prior Publication Data

US 2003/0214985 A1 Nov. 20, 2003

(30) Foreign Application Priority Data

Mar. 16, 2002 (EP) .................................. 02251899

(51) Int. Cl.
*H01S 3/08* (2006.01)
(52) U.S. Cl. ..................... 372/99; 372/32; 372/50.21
(58) Field of Classification Search .............. 372/29.02, 372/32, 38.01
See application file for complete search history.

(56) References Cited

U.S. PATENT DOCUMENTS

| | | | |
|---|---|---|---|
| 4,309,671 A | 1/1982 | Malyon | |
| 4,897,711 A * | 1/1990 | Blonder et al. | 257/48 |
| 5,825,792 A | 10/1998 | Villeneuve et al. | |
| 6,144,025 A | 11/2000 | Tei et al. | |
| 6,181,412 B1 * | 1/2001 | Popescu et al. | 356/4.09 |
| 6,400,739 B1 | 6/2002 | Auracher | |
| 6,765,940 B2 * | 7/2004 | Short | 372/32 |
| 6,826,211 B2 * | 11/2004 | Tatsuno et al. | 372/34 |
| 7,061,947 B2 * | 6/2006 | Short | 372/29.02 |
| 2001/0036206 A1 * | 11/2001 | Jerman et al. | 372/20 |
| 2002/0012369 A1 | 1/2002 | Nasu | |
| 2002/0071458 A1 * | 6/2002 | Iwafuji | 372/23 |
| 2002/0075912 A1 * | 6/2002 | Ito et al. | 372/32 |
| 2002/0096728 A1 * | 7/2002 | Kuhlmann | 257/432 |
| 2003/0016707 A1 * | 1/2003 | McDonald et al. | 372/20 |
| 2003/0072336 A1 * | 4/2003 | Senapati et al. | 372/32 |

FOREIGN PATENT DOCUMENTS

WO WO-98/43327 10/1998

* cited by examiner

*Primary Examiner*—Dung T Nguyen

(57) ABSTRACT

A wavelength of an optical source is monitored by first and second adjacent detectors on a common base. A bulk reflective component has first and second partially reflective surfaces that respectively direct first and second portions of energy from the source to the first and second detectors. A wavelength discriminator is positioned between the first detector and first surface. An optical isolator downstream of the reflective component prevents radiation from the source and exiting the component from being coupled to the detectors and back to the source.

16 Claims, 1 Drawing Sheet

WAVELENGTH MONITORING METHOD AND APPARATUS AND METHOD OF MAKING SAME

RELATED APPLICATIONS

The present application is based on, and claims priority to European Application Serial Number 02251899.7, filed Mar. 16, 2002, the disclosure of which is hereby incorporated by reference herein in its entirety.

FIELD OF INVENTION

The present invention relates to an apparatus for and method of monitoring a wavelength of optical electromagnetic radiation and to a method of making such an apparatus.

BACKGROUND ART

In a fibre-optic network, the wavelength of light used to communicate a signal is an important parameter. In particular, where Wavelength Division Multiplexing (WDM) systems are employed, different signals are communicated using different wavelengths. Consequently, it is important to maintain the different wavelengths accurately in relation to components of the WDM system, for example multiplexers and demultiplexers, which add or remove wavelengths from the WDM system.

Typically, a semiconductor laser device is employed in a transmitter unit of the fibre-optic network. The wavelength of light transmitted by the laser device can be accurately controlled by altering a parameter, for example temperature, of the laser device using a closed loop feedback circuit. In this example, in order to determine whether to heat or cool the laser device, and to what extent, to restore the wavelength of the laser device to a predetermined wavelength, an error is typically generated in the feedback circuit.

Known apparatus for detecting changes in the wavelength of a laser device are disclosed inter alia, in U.S. Pat. Nos. 4,309,671, 6,144,025, 5,825,792, all of which are incorporated herein by reference.

U.S. Pat. No. 4,309,671 discloses a laser diode, a proximal beam splitting mirror and a proximal photodiode to receive light from the proximal beam splitting mirror, a distal beam splitting mirror and a distal photodiode to receive light from the distal beam splitting mirror, and a filter disposed between the distal beam splitting mirror and the distal photodiode. An electronic control circuit stabilizes the laser diode. In use, a divergent beam is emitted by the laser diode. The proximal beam splitting mirror directs a portion of the light incident on the proximal beam splitting mirror onto the proximal photodiode. Similarly, light passing through the proximal beam splitting mirror is incident on the distal beam splitting mirror. The distal beam splitting mirror directs a portion of the light incident on the distal beam splitting mirror onto the distal photodiode. Since the light continues to diverge as it propagates from the proximal beam splitting mirror to the distal beam splitting mirror, the distal photodiode only receives a small fraction of the light directed towards the distal photodiode. In order to ensure that beams eminating from the proximal and distal beam splitting mirrors are not obstructed, the beam splitting mirrors and the photodiodes must be widely spaced. The provision of two beam splitting mirrors spaced apart and the need for individual placement and careful alignment of the beam splitting mirror results in relatively high cost and large volume of the above apparatus. Similarly, the need to carefully place and align the proximal and distal photodiodes is a costly exercise that contributes to the large volume of the apparatus. Additionally, the spacing of two beam splitting mirrors results in the proximal and distal photodiodes being unable to make efficient use of the portions of light respectively directed towards them due to the divergent nature of the beam emitted by the laser diode.

U.S. Pat. No. 5,825,792 discloses a relatively compact apparatus comprising a lens, a Fabry-Perot etalon and two photodiodes. The apparatus is small enough to be copackaged with a semiconductor laser in an industry standard package known as a "butterfly" package. The etalon splits light emitted by the semiconductor laser and directs the light over multiple paths of different lengths before recombination. Respective wavelength dependent phases are accumulated over the multiple paths. Consequently, the result of the recombination also depends on wavelength.

The dimensions of the etalon depend on a required resolving power, R, of the etalon; the resolving power is a measure of a minimum change of wavelength that can be detected. The resolving power, R, of the etalon is given by the following equation:

$$R = F\frac{2nd}{\lambda_o}$$

where:

F is the coefficient of finesse,
n is the refractive index of the etalon,
d is the thickness of the etalon, and
$\lambda_o$ is the wavelength of operation.

As a practical example, in order to monitor a 100 GHz or 50 GHz channel spacing, at least one dimension of the etalon has to be approximately 1 mm or approximately 2 mm, respectively. Clearly, such dimensions are large compared with a typical dimension of a semiconductor laser of approximately 300 μm.

Hence, as explained above in relation to U.S. Pat. Nos. 4,309,671 and 5,825,792, to copackage the semiconductor laser device with the etalon requires a package that is substantially larger than a package for the semiconductor laser device alone, since for small channel spacings the dimensions of the etalon are large. Also, the etalon of the apparatus of U.S. Pat. No. 5,825,792 requires very precise angular alignment with respect to the beam emitted by the laser device. Furthermore, with respect to U.S. Pat. No. 5,825,792, no "transmitted beam" is provided for onward propagation into a WDM system. There is therefore a need to locate the apparatus of U.S. Pat. No. 5,825,792 adjacent a back facet of the semiconductor laser, thereby restricting available space for other components as well as, in some cases, disadvantageously increasing lengths of Radio Frequency (RF) paths to the semiconductor laser.

U.S. Pat. No. 6,144,025 discloses a laser diode coupled to a first optical fibre. In use, light emitted by the laser diode propagates through the first optical fibre, a lens, a cut filter, thence the light is incident upon a beam splitter. A first photodiode is located on a first side of the beam splitter and a second photodiode is located on a second side of the beam splitter. An optical band-pass filter is disposed in-line between the beam splitter and the first photodiode. A portion of the light incident on the beam splitter is directed towards the first photodiode. A first portion of the light directed towards the first photodiode is passed through to the first photodiode and a second portion of the light directed towards the first photodiode is reflected by the optical band-pass filter and coupled to the second photodiode via the beam splitter. A certain portion of the light incident on the beam splitter via the cut filter passes directly through the beam splitter to a lens that focuses the transmitted light into a second optical fibre.

The apparatus of U.S. Pat. No. 6,144,025 requires the first and second photodiodes to be relatively widely separated. The photodiodes can not, therefore, be formed as a joined pair of detectors and require individual placement and alignment. Also, the beam splitter and the optical band-pass filter have to be aligned with angular precision, because light incident on the second photodiode is reflected by the beam splitter and the optical band-pass filter. Small angular errors in the position of the beam splitter and the optical band-pass filter cause the beam to be displaced laterally at the locations of the first and second photodiodes. Additionally, the first and second photodiodes of the apparatus of U.S. Pat. No. 6,144,025 are separate and so are susceptible to the effects of ageing and temperature differences.

SUMMARY OF THE INVENTION

According to a first aspect of the present invention, an apparatus for monitoring a wavelength of optical electromagnetic radiation comprises: a first optical radiation detector disposed adjacent a second detector. A reflective component, positioned so the monitored radiation is incident on it, supplies first and second portions of the monitored radiation to the first and second detectors, respectively. A wavelength discriminator is in the path of the first beam to control the wavelength incident on the first detector. The reflective component is a bulk component having a first partially reflective surface for reflecting, when in use, the first portion of the electromagnetic radiation towards the first detector via the wavelength discriminator, and a second partially reflective surface for reflecting, when in use, the second portion of the electromagnetic radiation towards the second detector. The second partially reflective surface is substantially opposite the first partially reflective surface so that, e.g. the first and second partially reflective surfaces are on opposite faces of the reflective component.

The position of the first partially reflective surface relative to the first detector and the position of the second partially reflective surface relative to the first partially reflective surface and the second detector are preferably arranged to reflect the first portion and the second portion of electromagnetic radiation incident on the reflective component for incidence on the first detector and the second detector, respectively. The first detector has a predetermined separation from the second detector. Preferably, the first and second portions are directed as first and second distinct beams toward the first and second detectors. The reflective component is preferably disposed at an angle to a propagation path of the electromagnetic radiation propagating towards the reflective component. Preferably, the angle is such that the first and second portions of the electromagnetic radiation are separated by a predetermined separation distance and are respectively incident on the first and second detectors.

Preferably, the apparatus further comprises an optical isolator device downstream of the reflective component to prevent unreflected electromagnetic radiation propagating through the reflective component from being fed back through the reflective component to the detectors and or radiation source.

Preferably, at least one of the first and second partially reflective surfaces includes a reflective coating.

Preferably, at least one of the first and second partially reflective surfaces includes an anti-reflective coating.

Preferably, the reflective component is a prism that can be formed from silicon or silica, or any other electromagnetic radiation transmissive material.

Preferably, the apparatus further comprises a base for disposing at least one of the first detector, the second detector, the reflective component, and wavelength discriminator thereupon. Preferably, the base is a semiconductor base. The semiconductor base can be grown and profiled using known semiconductor processing techniques, such as micromachining.

According to a second aspect of the present invention, an apparatus for monitoring a wavelength of electromagnetic radiation comprises: an electromagnetic radiation director arranged to direct a first portion of electromagnetic radiation incident thereon and couple a second portion of the incident electromagnetic radiation through it. An optical isolator device is located adjacent the electromagnetic radiation director so a substantial amount of the second portion of the incident electromagnetic radiation is incident on it. The optical isolator thereby prevents, when in use, the second portion of the incident electromagnetic radiation from being fed back through the electromagnetic radiation director.

The optical electromagnetic radiation director can be any suitable device for directing a portion of the optical electromagnetic radiation incident on it along an incident propagation path to direct the portion of the electromagnetic radiation away from the incident propagation path that can include, for example, the reflective component described herein, a beam splitting mirror, or a diffractive optical element, such as a diffraction grating or photonic crystal.

According to a third aspect of the present invention, an isolator device is used to prevent optical electromagnetic radiation emitted by a source of the optical electromagnetic radiation from being fed through an optical electromagnetic radiation director to a source of the optical electromagnetic radiation.

According to a fourth aspect of the present invention, a method of manufacturing an apparatus for monitoring a wavelength of optical electromagnetic radiation comprises forming a base using a micromachining manufacturing technique and disposing a component on the base to form a part of a component configuration of a wavelength monitoring apparatus.

Preferably, the method further comprises the step of affixing the component to the base. The component can be the reflective component.

A number of different components (for example a laser device, or one or more detectors) can be disposed on the base by growth or otherwise.

According to a fifth aspect of the present invention, a method of monitoring a wavelength of electromagnetic radiation uses an apparatus for monitoring the wavelength of the optical electromagnetic radiation, wherein the apparatus comprises a first optical detector disposed adjacent a second optical detector; a wavelength discriminator disposed adjacent the first detector; and a reflective component. The method comprises the steps of: directing the electromagnetic radiation towards the reflective component that is a bulk component having a first partially reflective surface and a second partially reflective surface. The first partially reflecting surface reflects a first portion of the electromagnetic radiation towards the first detector via the wavelength discriminator. The second partially reflective surface reflects a second portion of the electromagnetic radiation towards the second detector. The second partially reflective surface is substantially opposite the first partially reflective surface.

According to a sixth aspect of the present invention first and second partially reflective surfaces of a bulk component are used for respectively reflecting first and second portions of optical electromagnetic radiation incident on the bulk component in order to monitor a wavelength of the electromagnetic radiation.

According to a seventh aspect of the present invention, a reflective component for a wavelength monitoring apparatus comprises a bulk component having a first partially reflective surface and a second partially reflective surface substantially opposite the first partially reflective surface. The first partially reflective surface is arranged relative to the second partially reflective surface so as to reflect a first portion and a second portion of electromagnetic radiation incident on the bulk component for respective incidence on a first detector having a predetermined separation from a second, adjacent, detector.

The various embodiments set forth above constitute, where appropriate, a wavelength locker apparatus.

It should be appreciated that references to "light" and "optical electromagnetic radiation" and "optical radiations" herein refer to electromagnetic radiation of wavelengths between about 300 nm and about 10 µm, preferably between about 400 nm and about 2 µm, very preferably between about 800 nm and 1700 nm.

It is thus possible to provide a relatively compactly packagable apparatus that can be conveniently co-packaged with a laser device and that permits the use of photodiodes as joined pairs, thereby automatically compensating for ageing effects of the photodiodes and temperature differences therebetween. The use of joined pairs of photodiodes and a single reflective component also overcomes the need for precise angular alignment of multiple beam splitting mirrors with respect to beams reflected thereby. Consequently, it can be seen that fewer optical components are required to form the apparatus, resulting in reduced costs and improved ease of assembly.

Additionally, the provision of the isolator device prevents disruption of the correct functioning of a source of electromagnetic radiation, for example a semiconductor laser device.

The provision of a base permits location of components, which together constitute an apparatus for monitoring a wavelength of electromagnetic radiation, with improved precision, thereby facilitating reduced component separation and thus the provision of a smaller overall assembly. Also, an improved yield is possible, resulting in a reduced assembly cost.

BRIEF DESCRIPTION OF THE DRAWING

At least one embodiment of the invention is now described, by way of example only, with reference to the accompanying drawings in which:

Throughout the following description identical reference numerals identify like parts.

Referring to FIG. 1, a laser device, for example a semiconductor laser diode 100 is disposed in a package 102 and is ultimately arranged (although not shown) to launch light into an optical fibre (not shown) downstream of package 102. A collimating lens 104, in this example a ball lens, is disposed adjacent the laser diode 100 in the path of the light from laser diode 100 to produce a collimated beam 110 (sometimes referred to as first optical path 110). A reflective component 108, in this example a bulk component double having a first partially reflective surface 109 substantially opposite a second partially reflective surface 111, acts as a double beam splitter and is disposed in first optical path 110 adjacent the collimating lens 104. Surfaces 109 and 111 are on opposite substantially parallel faces of reflective component 108.

Figure 1:
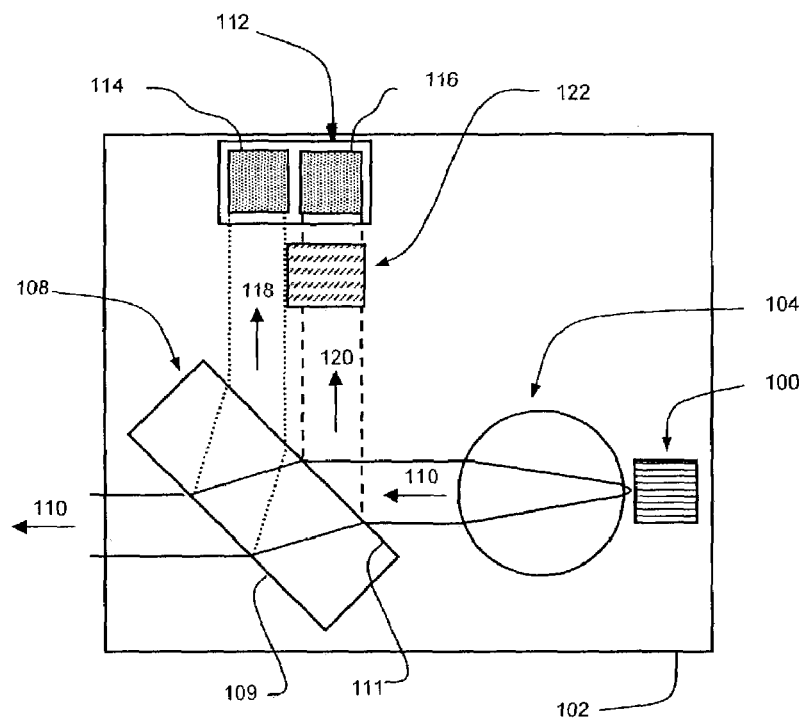
FIG. 1 is a schematic diagram of a wavelength locking apparatus according to a first embodiment of the present invention.

To one side of the first optical path 110, a dual photodiode 112 is disposed. The dual photodiode 112 comprises a first photodiode 114 disposed at a predetermined spacing adjacent a second photodiode 116; photodiodes 114 and 116 are carried by the same substrate. The beam splitter 108 is placed and aligned to direct light along a second optical path 118 towards the first photodiode 114. Similarly, the placement and alignment of the beam splitter 108 are such so as to direct light along a third optical path 120 towards the second photodiode 116 adjacent the first photodiode 114. An angle at which the beam splitter 108 is disposed relative to the first optical path 110 is one factor that dictates the direction of the second and third optical paths 118, 120. Another factor is the relative position of the first partially reflective surface 109 and the second partially reflective surface 111 which can be varied so as to control respective reflection towards the first and second photodiodes 114, 116. A wavelength discriminator 122, for example an edge filter or etalon, is disposed adjacent the second photodiode 116 and in the third optical path 120.

In operation, light emitted by the laser diode 100 follows the first optical path 110 and is collimated by the collimating lens 104 before propagating towards beam splitter 108. Upon incidence on the beam splitter 108, a first portion of the light energy emitted by the laser diode 100 is reflected by the first partially reflective surface 109 towards the first photodiode 114 along the second optical path 118. A second portion of the light energy emitted by the laser diode 100 is reflected by the second partially reflective surface 111 towards the second photodiode 116 along the third optical path 120. Most of the remaining, unreflected, light propagates through the beam splitter 108 so as to continue substantially along the first optical path 110 and exit the package 102. The onward propagation of the remaining, unreflected, light is not relevant for the purpose of describing examples of the invention and is not described further.

Depending upon the wavelength of the light emitted by the laser diode 100, a fraction of the second portion of the light energy emitted by the laser diode 100 is coupled through the wavelength discriminator 122 towards the second photodiode 116. The use and calibration of wavelength discriminators in wavelength monitoring apparatus is known in the art and so is not described further.

An output ratio calculator unit (not shown) coupled and responsive to electrical output signals of the first and second photodiodes 114, 116, for example as described in U.S. Pat. No. 6,144,025, generates an error signal. The error signal can be used by a driver circuit (not shown) for the laser diode 100. The driver circuit is, for example, a proportional integral differential (PID) controller to influence the wavelength of light generated by the laser diode 100 to ensure that the wavelength of the light generated by the laser diode 100 remains substantially at a required wavelength. The wavelength of light generated by the laser diode 100 can be controlled, e.g., by controlling the temperature of the laser diode 100, or if more than one current is applied to the laser diode 100, controlling one or more of those currents partially.

It should be appreciated that one or both of the partially reflective surfaces 109, 111 can be provided with, in part, or substantially completely, one or more reflective coatings. One or more parts of the partially reflective surfaces 109, 111 can be provided with an anti-reflection coating to prevent internal back reflections by the second partially reflective surface 111. Additionally, it should be understood that the beam splitter 108 can be formed from any suitable at least partially light-transmissive material, such as suitably finished silicon or silica.

Figure 2:
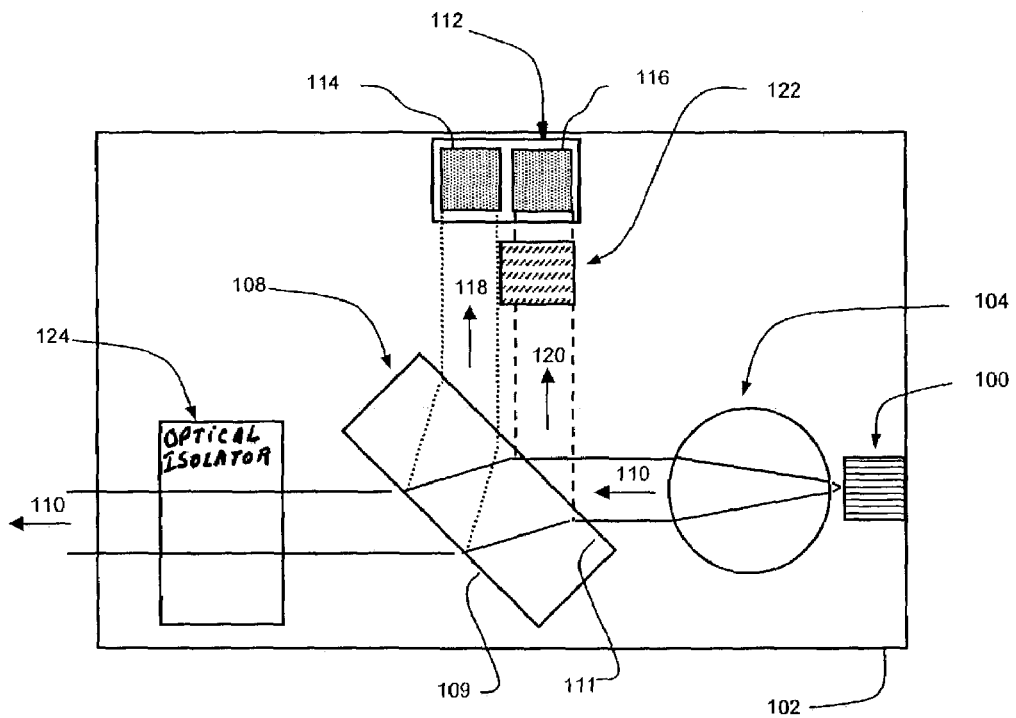
FIG. 2 is a schematic diagram of a wavelength locking apparatus according to a second embodiment of the present invention.

In another embodiment, and referring to FIG. 2, the apparatus of FIG. 1 is modified to include an optical isolator 124 positioned adjacent and downstream the beam splitter 108 to receive light in path 110 propagating through the beam splitter 108. The isolator 124 is any suitable known isolator that transmits optical energy in only one direction and prevents the electromagnetic radiation that has propagated through the beam splitter 108, or any means/device(s) for directing the optical electromagnetic radiation, from being fed back to the laser device 100 and/or detectors 114 and 116.

The above embodiment can be modified by replacing the apparatus for monitoring wavelength with any suitable component arrangement for measuring the wavelength of optical electromagnetic radiation and where one or more devices are employed for directing optical electromagnetic radiation. The device for directing electromagnetic radiation enables a portion of the optical electromagnetic radiation incident on it to propagate through it without substantial reflection and or direction change. It should be appreciated that, in these embodiments employing the isolator device 124, the optical isolator is not disposed as is conventionally the case as near to the laser as possible, either adjacent the laser, or adjacent the lens, if there is insufficient space between the laser and the lens, but at the "output" of the means for directing electromagnetic radiation, for example as the "output" of beam splitter 108.

In a further embodiment, any of the apparatus described above constituting a component configuration for monitoring a wavelength of electromagnetic radiation is disposed on a base, for example a bench such as a silicon bench. The silicon bench is formed by any suitable known semiconductor processing technique that causes, inter alia, one or more recesses to be formed on the bench for one or more components, respectively. A suitable fabrication technique is micromachining. Reference features are fabricated, such as a fiducial or a v-groove on the silicon optical bench to enable components to be precisely placed on the silicon bench. The one or more components are bonded to the silicon bench using a suitable adhesive, such as an epoxy adhesive. In addition or alternatively, one or more devices can be grown on the silicon bench.

The invention claimed is:

1. A source of optical energy comprising a semiconductor laser diode, a base carrying (a) a dual photodiode including first and second photodiodes in side-by-side relationship, (b) a single reflective component, and (c) a wavelength discriminator; the reflective component being a bulk component having first and second partially reflective surfaces; the dual photodiode, reflective component, and wavelength discriminator being located on the base and with respect to the semiconductor laser diode for causing optical energy emitted by the diode to be incident on the reflective component for forming distinct first and second beams directed in the same direction and to be respectively incident on the first and second photodiodes; the wavelength discriminator being in the path of the first beam between the reflective component and the first photodiode.

2. The apparatus of claim 1 further comprising an optical isolator device disposed downstream of the reflective component for preventing unreflected electromagnetic radiation propagating through the reflective component from being fed back through the reflective component.

3. The apparatus of claim 1, wherein at least one of the first and second partially reflective surfaces comprises a partially reflective coating.

4. The apparatus of claim 1, wherein at least one of the first and second partially reflective surfaces comprises an anti-reflective coating.

5. The apparatus of claim 1, wherein the reflective component is a prism.

6. The apparatus of claim 1, wherein the base is a semiconductor base.

7. The source of claim 1 further including a controller coupled to be responsive to electrical outputs of the first and second photodiodes for maintaining the wavelength of the optical energy emitted by the semiconductor diode laser substantially constant.

8. The source of claim 7, wherein the wavelength discriminator is an edge filter.

9. The source of claim 7, wherein the wavelength discriminator is an etalon.

10. The source of claim 1, wherein the wavelength discriminator is an edge filter.

11. The source of claim 1, wherein the wavelength discriminator is an etalon.

12. The source of claim 1, wherein the dual photodioide, reflective component and wavelength discriminator are arranged on the base to automatically compensate for aging effects of the photodiodes, and temperature differences between them.

13. Apparatus for use in a monitor for the wavelength of a semiconductor laser diode, the apparatus comprising a base carrying (a) a dual photodiode including first and second photodiodes in side-by-side relationship, (b) a single reflective component, and (c) a wavelength discriminator; the reflective component being a bulk component having first and second partially reflective surfaces; the dual photodiode, reflective component, and wavelength discriminator being located on the base and adapted to be positioned and arranged with respect to the laser diode for causing optical energy emitted by the diode to be incident on the reflective component for forming distinct first and second beams directed in the same direction and to be respectively incident on the first and second photodiodes; the wavelength discriminator being in the path of the first beam between the reflective component and the first photodiode.

14. The apparatus of claim 13 in combination with a controller coupled to be responsive to electrical outputs of the first and second photodiodes for enabling the wavelength of the optical energy emitted by the semiconductor diode laser to be substantially constant.

15. The apparatus of claim 13, wherein the base is a semiconductor base.

16. The source of clam 13, wherein the dual photodiode, reflective component and wavelength discriminator are arranged on the base to automatically compensate for aging effects of the photodiodes, and temperature differences between them.

* * * * *